United States Patent
Yagi et al.

(10) Patent No.: US 7,830,467 B2
(45) Date of Patent: *Nov. 9, 2010

(54) ELECTRODES LOCATED AT STORAGE CAPACITOR WIRING IN ACTIVE MATRIX SUBSTRATE

(75) Inventors: Toshifumi Yagi, Tsu (JP); Toshihide Tsubata, Tsu (JP); Masanori Takeuchi, Tsu (JP); Yuhko Hisada, Matsusaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 149 days.

This patent is subject to a terminal disclaimer.

(21) Appl. No.: 12/193,513

(22) Filed: Aug. 18, 2008

(65) Prior Publication Data
US 2008/0309841 A1    Dec. 18, 2008

Related U.S. Application Data

(62) Division of application No. 11/041,361, filed on Jan. 25, 2005, now Pat. No. 7,430,024.

(30) Foreign Application Priority Data

Jan. 28, 2004 (JP) .............................. 2004-020488
Dec. 2, 2004 (JP) .............................. 2004-349590

(51) Int. Cl.
G02F 1/1343 (2006.01)
G02F 1/1333 (2006.01)

(52) U.S. Cl. ............................. 349/54; 349/38; 349/39

(58) Field of Classification Search .................. 349/38, 349/39, 54
See application file for complete search history.

(56) References Cited

U.S. PATENT DOCUMENTS

| | | | |
|---|---|---|---|
| 5,042,916 | A | 8/1991 | Ukai et al. |
| 5,173,792 | A | 12/1992 | Matsueda et al. |
| 5,208,690 | A | 5/1993 | Hayashi et al. |
| 5,337,173 | A | 8/1994 | Atsumi et al. |
| 5,483,082 | A | 1/1996 | Takizawa et al. |
| 6,052,162 | A | 4/2000 | Shimada et al. |
| 6,097,452 | A | 8/2000 | Shimada et al. |
| 6,175,393 | B1 | 1/2001 | Ban et al. |
| 6,195,138 | B1 | 2/2001 | Shimada et al. |

(Continued)

FOREIGN PATENT DOCUMENTS

CN    1327167 A    12/2001

(Continued)

*Primary Examiner*—Julie-Huyen L Ngo
(74) *Attorney, Agent, or Firm*—Birch, Stewart, Kolasch & Birch, LLP

(57) ABSTRACT

An active matrix substrate includes a thin film transistor, a scanning signal line, and a data signal line disposed on the substrate. A gate electrode of the transistor is connected to the scanning signal line, a source electrode thereof is connected to the data signal line, and a drain electrode thereof is connected to a pixel electrode; and an upper electrode is disposed so as to oppose a storage capacitor wiring pattern at least via an insulating layer. Within a pixel region, the upper electrode includes three divided electrodes in a region opposing the storage capacitor wiring pattern, and a central divided electrode of the three divided electrodes has the smallest area.

5 Claims, 7 Drawing Sheets

U.S. PATENT DOCUMENTS

| | | |
|---|---|---|
| 6,433,851 B2 | 8/2002 | Shimada et al. |
| 6,515,720 B1 | 2/2003 | Iizuka et al. |
| 6,839,099 B2 | 1/2005 | Fukunishi et al. |
| 6,947,103 B2 * | 9/2005 | Sakurai et al. ............... 349/43 |
| 6,969,889 B2 * | 11/2005 | Cho et al. ................... 257/347 |
| 7,176,989 B2 * | 2/2007 | Takahara et al. ............. 349/39 |
| 7,330,222 B2 | 2/2008 | Shiraki et al. |
| 7,430,024 B2 * | 9/2008 | Yagi et al. .................... 349/54 |
| 2001/0052889 A1 | 12/2001 | Fukunishi |
| 2003/0234399 A1 * | 12/2003 | Jeon et al. ..................... 257/72 |
| 2004/0222419 A1 | 11/2004 | Matsui et al. |
| 2005/0162599 A1 | 7/2005 | Kurihara et al. |

FOREIGN PATENT DOCUMENTS

| | | |
|---|---|---|
| JP | 01-303415 A | 12/1989 |
| JP | 03-194516 | 8/1991 |
| JP | 06-095157 A | 4/1994 |
| JP | 06-202153 | 7/1994 |
| JP | 07-270824 A | 10/1995 |
| JP | 9-90318 A | 4/1997 |
| JP | 09-152625 A | 6/1997 |
| JP | 09-222615 A | 8/1997 |
| JP | 2001-330850 A | 11/2001 |
| JP | 2002-055361 | 2/2002 |
| JP | 2004-318086 A | 11/2004 |

* cited by examiner

US 7,830,467 B2

ELECTRODES LOCATED AT STORAGE CAPACITOR WIRING IN ACTIVE MATRIX SUBSTRATE

REFERENCE TO RELATED APPLICATIONS

This is a divisional of application Ser. No. 11/041,361, filed Jan. 25, 2005, now U.S. Pat. No. 7,430,024 which claims priority under 35 U.S.C. §119(a) on Patent Application No. 2004-20488 filed in Japan on Jan. 28, 2004 and No. 2004-349590 filed in Japan on Dec. 2, 2004, the entire contents of which are hereby incorporated by reference.

BACKGROUND OF THE INVENTION

1. Field of the Invention

The present invention relates to an active matrix substrate and a display device. More particularly, it relates to an active matrix substrate provided with a thin film transistor and a storage capacitor element at each pixel for driving the liquid crystal layer, and to an active matrix type liquid crystal display device.

2. Description of the Related Art

Active matrix substrates are widely used in active matrix type display devices such as liquid crystal display devices and electroluminescence (EL) display devices. In the conventional active matrix type liquid crystal display devices using such active matrix substrates, a plurality of scanning signal lines and a plurality of data signal lines intersecting with the scanning signal lines are disposed on each substrate, and a thin film transistor (hereinafter also referred to as "TFT"), among others, is disposed at each point of intersection. An image signal is transmitted to each pixel unit by the switching function of the TFT and so forth. It has also been disclosed that each pixel unit be provided with a storage capacitor element (cf. e.g. Japanese Kokai Publication H06-95157, page 1). Such storage capacitor element prevents the image signal from deteriorating due to the self discharge of the liquid crystal layer or the OFF-state current in the TFT during the OFF period of the TFT. Further, the storage capacitor element is utilized not only for storing an image signal during the OFF period of the TFT but also as a route for applying any of various modulated signals in liquid crystal driving, for instance. A liquid crystal display device equipped with storage capacitor elements can realize low electricity consumption and high picture quality.

An example of the structure of a conventional active matrix substrate is now described referring to the drawings.

FIG. 4 is a schematic plan view illustrating the constitution of one pixel in an active matrix substrate equipped with a storage capacitor element and used in a conventional active matrix type liquid crystal display device.

In FIG. 4, a plurality of pixel electrodes 51 are disposed to form a matrix in an active matrix substrate, and a scanning signal line 52 for feeding a scanning signal and a data signal line 53 for feeding a data signal are disposed surrounding those pixel electrodes 51 and intersecting with each other. At each point of intersection of the scanning signal line 52 and data signal line 53, there is disposed a TFT 54 as a switching element to be connected to the pixel electrode 51. The scanning signal line 52 is connected to the gate electrode of that TFT 54, and the TFT 54 is driven and controlled by the scanning signal inputted into the gate electrode. Further, the data signal line 53 is connected to the source electrode of the TFT 54, and a data signal is inputted into the source electrode of the TFT 54. Furthermore, to the drain electrode, there are connected an interconnection electrode 55, one electrode (storage capacitor upper electrode) 55a of a storage capacitor element via the interconnection electrode 55, and the pixel electrode 51 via a contact hole 56. A storage capacitor (common) wiring pattern 57 functions as the other electrode (storage capacitor lower electrode) of that storage capacitor element.

FIG. 5 is a schematic sectional view illustrating a section of the active matrix substrate shown in FIG. 4 as cut along the line A-A'.

In FIG. 5, there is seen a gate electrode 62 disposed on a transparent insulating substrate (insulator substrate) 61 made of glass, plastic or like material and connected to a scanning signal line 52. The scanning signal line 52 and gate electrode 62 are formed of a film or layer of a metal such as titanium, chromium, aluminum or molybdenum or an alloy thereof, or a laminate thereof. The storage capacitor (common) wiring pattern 57, which constitutes the other electrode of the storage capacitor element (storage capacitor lower electrode), is made of the same material as the scanning signal line 52 and gate electrode 62. A gate insulator (gate insulating layer) 63 is disposed to cover the same. The gate insulator 63 is made of an insulation layer such as a silicon nitride or silicon oxide layer. Thereon are disposed, in a manner overlapping with the gate electrode 62, a high-resistivity semiconductor layer 64 made of amorphous silicon, polysilicon or the like, and a low-resistivity semiconductor layer consisting of $n^+$ amorphous silicon or the like doped with such an impurity as phosphorus and coming to a source electrode 66a and a drain electrode 66b. Further, a data signal line 53 is disposed so as to connect to the source electrode 66a. Furthermore, an interconnection electrode 55 is disposed so as to connect to the drain electrode 66b, and the interconnection electrode 55 is extended to constitute a storage capacitor upper electrode 55a, which is one of the electrodes of the storage capacitor element, and is connected to a pixel electrode 51 via a contact hole 56. The data signal line 53, interconnection electrode 55 and storage capacitor upper electrode 55a are made of the same material, and a layer of a metal such as titanium, chromium, aluminum or molybdenum or an alloy thereof, or a laminate thereof is used as the material. The pixel electrode 51 is formed, for example, of a transparent conductive layer such as an ITO (indium tin oxide), IZO (indium zinc oxide), zinc oxide or tin oxide layer. The contact hole 56 is formed so as to pass through an interlayer insulating film or layer 68 formed to cover the top of each of the TFT 54, scanning signal line 52, data signal line 53 and interconnection electrode 55. The material of the interlayer insulating layer 68 is, for example, an acrylic resin, silicon nitride, or silicon oxide. An active matrix substrate having such a structure as shown in FIGS. 4 and 5 is disclosed, for example, in Japanese Kokai Publication H09-152625, pages 8-11 and 19, drawings 3 and 4.

In an active matrix substrate having such a structure, the storage capacitor (common) wiring pattern (storage capacitor lower electrode) and scanning signal line are formed in one and the same step, and the storage capacitor upper electrode, data signal line and interconnection electrode are formed in one and the same step for the purposes of simplifying the manufacturing step and reducing the production cost. Further, when the pixel electrode is formed on an interlayer insulating layer, as shown in FIG. 5, the pixel electrode can be overlapped with each signal line, so that the aperture ratio can be increased and, further, the effect of shielding the pixel electrode against the electric field of each signal line can also be produced. On that occasion, the connection between the pixel electrode and drain electrode is secured via the interconnection electrode by forming a contact hole in the interlayer insulating layer on the storage capacitor (common) wiring pattern or scanning signal line pattern to thereby connect the pixel electrode to the storage capacitor upper electrode. The position of the contact hole is not restricted to a site on the storage capacitor upper electrode but may be on the interconnection electrode. However, as shown in FIG. 4, the contact hole is preferably formed at the site of the storage capacitor upper electrode on a pattern of the storage capacitor (common) wiring pattern, since the aperture ratio is not further reduced thereby.

In the storage capacitor element in the active matrix substrate as shown in FIGS. 4 and 5, the presence of a conductive foreign material or a pinhole in the insulating layer between the storage capacitor wiring pattern (storage capacitor lower electrode) and storage capacitor upper electrode may result in a short circuit between the storage capacitor wiring pattern (storage capacitor lower electrode) and the storage capacitor upper electrode, which, in turn, result in a dot defect at the site of the short-circuited pixel in the image displayed; in this respect, there is room for improvement. Further, in the case of short-circuiting between the data signal line and storage capacitor upper electrode, which are formed in one and the same step, due to such a defect as a residual layer, a dot defect may appear in the same manner and the defect cannot be repaired; in this respect, there is also room for improvement.

As the countermeasure for such a dot defect, the method comprising dividing the storage capacitor wiring pattern in the pixel and the method comprising disposing a redundant line in the storage capacitor wiring pattern are disclosed (cf. e.g. Japanese Kokai Publication H01-303415, pages 2-4, drawing 1 and Japanese Kokai Publication H09-222615, pages 3, 4, 6 and 7, drawings 1-3).

In the active matrix substrate in which the storage capacitor wiring pattern is made redundant according to the method of dividing the storage capacitor wiring pattern in the pixel as disclosed in Japanese Kokai Publication H01-303415, the storage capacitor (common) wiring pattern is partly multiplied within each pixel and, further, there is provided a structure such that when a conductive foreign material or a pinhole occurs in the insulating layer between the storage capacitor wiring pattern (storage capacitor lower electrode) and storage capacitor upper electrode and causes short-circuiting, the short-circuited storage capacitor wiring pattern (storage capacitor lower electrode) can be destructed and eliminated by means of a laser, for instance.

However, these methods can indeed destruct and eliminate a short-circuited storage capacitor wiring pattern (storage capacitor lower electrode) by means of a laser, for instance, upon occurrence of a short circuit between the storage capacitor wiring pattern and storage capacitor upper electrode due to the presence of a conductive foreign material or a pinhole in the insulating layer between the storage capacitor wiring pattern (storage capacitor lower electrode) and storage capacitor upper electrode but it is difficult to attain such destruction and elimination without damaging the insulating layer; in this respect, there is room for improvement. Further, when the storage capacitor upper electrode formed in the same step together with the data signal line is short-circuited with the data signal line due to a residual layer, for instance, the short-circuited storage capacitor upper electrode cannot be repaired while allowing the same as a storage capacitor element without resulting in a dot defect; in this respect, there is room for improvement.

Further, a method comprising constituting the storage capacitor electrode as an at least three-layer structure through the intermediary of insulating layers has been disclosed (cf. e.g. Japanese Kokai Publication H07-270824, pages 6-8, drawings 10 and 11). According to this method, the middle layer electrode (storage capacitor lower electrode) of the storage capacitor electrode formed in the form of at least three layers is divided into a plurality of sections and each section is connected to the lower layer electrode (storage capacitor lower electrode) via a contact hole. This gives a structure such that a middle layer electrode (storage capacitor lower electrode) short-circuited with the upper layer electrode (storage capacitor upper electrode) can be destructed and eliminated from the lower layer electrode (storage capacitor lower electrode) by means of a laser or the like and, in the case of a short circuit formed between the storage capacitor element electrodes, the short-circuited storage capacitor electrodes are partly destructed and eliminated by means of a laser or the like; the short circuit of the storage capacitor electrodes can be thus repaired to an extent such that the short circuit of the storage capacitor electrodes will not affect the display quality.

However, this method gives a structure such that each middle layer of a plurality of the divided storage capacitor lower electrodes is connected to the lower storage capacitor electrode in the lower layer via a contact hole and the storage capacitor upper electrode in the upper layer is used as a pixel electrode and, therefore, a simplification of the manufacturing process and a reduction of the manufacturing cost have been demanded.

Furthermore, a liquid display device having a first region comprising an auxiliary capacitor electrode (storage capacitor upper electrode) electrically connected to an interconnection wiring pattern (interconnection electrode) and to a contact hole, a third region formed at a site not overlapping with the auxiliary capacitor common wiring pattern (storage capacitor wiring pattern), and a second region electrically connected to the first region via that third region (cf. e.g. Japanese Kokai Publication 2001-330850, page 1). According to this construction, it is possible, when one of the first and second regions is short-circuited, to function the other region as a storage capacitor element by destructing and eliminating the short-circuited region.

However, the storage capacitor upper electrode formed in the same step as the data signal line is readily short-circuited with the data signal line due to a residual layer or the like, and the method described in Japanese Kokai Publication 2001-330850 cannot repair the first and second regions simultaneously in case of short-circuiting of both of them; in this respect, there is room for contrivance. Furthermore, when the first region of the auxiliary capacitor electrode, which is a part of the storage capacitor element, is short-circuited with the data signal line due to a residual layer, for instance, or when the first region is short-circuited, between layers, with the auxiliary capacitor common wiring pattern (storage capacitor wiring pattern) due to a pinhole or a conductive foreign material, the method described in Japanese Kokai Publication 2001-330850 requires that cleavage be made at the cleavage site X1 in the third region (cf. FIG. 1 in Japanese Kokai Publication 2001-330850) and at the cleavage site X3 of the interconnection wiring pattern (cf. FIG. 1 in Japanese Kokai Publication 2001-330850) and the connection points Y1 and Y2 (cf. FIG. 1 in Japanese Kokai Publication 2001-330850) be electrically connected to connect the interconnection wiring pattern to the second region via an interconnection electrode for repairing; thus, it is necessary to carry out laser irradiation at a total of 4 sites. Therefore, there is still room for contrivance for shortening the time of repairing and the step of repairing.

SUMMARY OF THE INVENTION

It is an object of the present invention, which has been made in view of the above-discussed problems, to provide an active matrix substrate in which faulty connections in storage capacitor elements as caused by a short circuit between storage capacitor electrodes due to a conductive foreign material or a pinhole in the insulating layer or by a short circuit between a data signal line and a storage capacitor upper electrode can be repaired with ease and a display device in which such active matrix substrate is used.

The present inventors made various investigations in search of an active matrix substrate in which faulty connections in storage capacitor elements can be repaired with ease and paid their attention to the fact that faulty connections are caused by short-circuiting of both ends of a storage capacitor upper electrode with a data signal line formed in the same step. And, they came to realize that when the storage capacitor upper electrode is divided into at least three, the function of the storage capacitor element can be maintained, even in the case of short-circuiting of the divided electrode occurring at both ends with the data signal line, by electrically separating the short-circuited divided electrode for effective functioning of the remaining divided electrode, and they have now completed the present invention.

Thus, the present invention provides an active matrix substrate comprising a thin film transistor disposed at the crossing point of a scanning signal line with a data signal line on the substrate, with a gate electrode of the transistor being connected to the scanning signal line, a source electrode thereof being connected to a data signal line and a drain electrode thereof being connected to a pixel electrode, and a storage capacitor upper electrode disposed so as to oppose a storage capacitor wiring pattern at least via an insulating layer, wherein the storage capacitor upper electrode comprises at least three divided electrodes in the region opposing the storage capacitor wiring pattern and each divided electrode is connected to the pixel electrode.

The invention also provides an active matrix substrate comprising a thin film transistor disposed at the crossing point of a scanning signal line with a data signal line on the substrate, with a gate electrode of the transistor being connected to the scanning signal line, a source electrode thereof being connected to the data signal line and a drain electrode thereof being connected to an interconnection electrode, and a storage capacitor upper electrode disposed so as to oppose a storage capacitor wiring pattern at least via an insulating layer and connected to an interconnection electrode and a pixel electrode, wherein the storage capacitor upper electrode comprises at least three divided electrodes in the region opposing the storage capacitor wiring pattern.

The invention further provides an active matrix substrate comprising a thin film transistor disposed at the crossing point of a scanning signal line and a data signal line on the substrate, with a gate electrode of the transistor being connected to the scanning signal line, a source electrode thereof being connected to the data signal line and a drain electrode thereof being connected to a pixel electrode, and a storage capacitor upper electrode disposed so as to oppose the scanning signal line at least via an insulating layer, wherein the storage capacitor upper electrode comprises at least three divided electrodes in the region opposing the scanning signal line and each divided electrode is connected to the pixel electrode.

The invention further provides an active matrix substrate comprising a thin film transistor disposed at crossing point of a scanning signal line with a data signal line on the substrate, with a gate electrode of the transistor being connected to the scanning signal line, a source electrode thereof being connected to the data signal line and a drain electrode thereof being connected to an interconnection electrode, and a storage capacitor upper electrode disposed so as to oppose the scanning signal line at least via a insulating layer and connected to the interconnection electrode and a pixel electrode, wherein the storage capacitor upper electrode comprises at least three divided electrodes in the region opposing the scanning signal line.

DETAILED DESCRIPTION OF THE INVENTION

Figure 1:
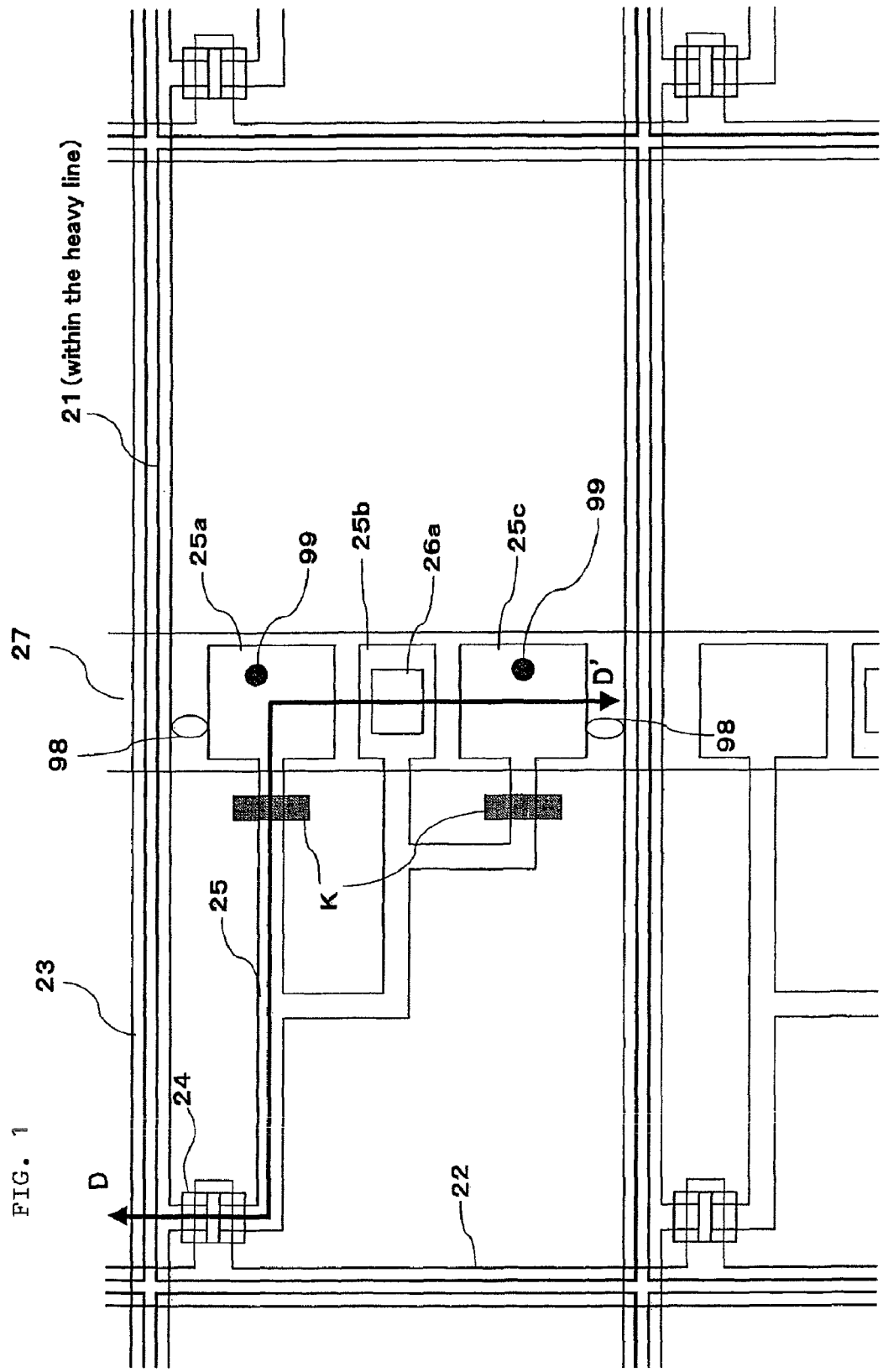
FIG. 1 is a schematic plan view showing the constitution of one pixel in an active matrix substrate in a preferred mode of embodiment of the invention (Cs-on-Common system).

The active matrix substrate of the invention comprises a thin film transistor and a storage capacitor upper electrode. Such a thin film transistor is disposed at crossing point of a scanning signal line with a data signal line on the substrate, with a gate electrode thereof is connected to the scanning signal line, a source electrode thereof is connected to the data signal line and a drain electrode thereof is connected to a pixel electrode or interconnection electrode. The thin film transistors can be used as switches for sampling data signals simultaneously fed to a plurality of data signal lines by the scanning signals successively fed to a plurality of scanning lines crossing with the data signal lines.

In cases where the drain electrode of a thin film transistor is (directly) connected to a pixel electrode and the drain electrode and pixel electrode are disposed in different layers via an insulating layer, the drain electrode is connected to the pixel electrode via a contact hole (conductive route for interlayer conduction). In cases where the drain electrode is connected to an interconnection electrode, the interconnection electrode and the pixel electrode are connected to a storage capacitor upper electrode. In that case, it is desirable that the interconnection electrode and storage capacitor upper electrode be connected to each other and at least one of the interconnection electrode and storage capacitor upper electrode be connected to the pixel electrode via a contact hole.

Namely, the pixel electrode may be directly connected to the interconnection electrode or directly connected to the storage capacitor upper electrode provided that it is electrically connected to the thin film transistor and storage capacitor upper electrode.

The storage capacitor upper electrode is disposed in a manner opposing the storage capacitor wiring pattern at least via an insulating layer and constitutes a storage capacitor element with them. As a preferred mode of such a storage capacitor wiring on a Cs-on-Common system, there may be mentioned the mode comprising a plurality of storage capacitor (common) wiring patterns disposed in parallel to the scanning signal lines. Each storage capacitor element can store a data signal fed to each data signal line, since the storage capacitor upper electrode is connected to the relevant thin film transistor via an interconnection electrode or pixel electrode. The storage capacitor upper electrodes are generally formed by forming a metal layer or like conductive layer by sputtering, followed by photolithography and etching.

The constitution of the active matrix substrate of the invention is not particularly restricted provided that it comprises such constituent elements as mentioned above as essential constituents. Thus, it may comprise or not comprise another or other constituent elements.

In accordance with the invention, a storage capacitor upper electrode comprises at least three divided electrodes in the region opposing the storage capacitor wiring pattern. Thus, the storage capacitor upper electrode is divided into at least three sections in the region occupied by the pattern of the storage capacitor wiring pattern. Each of the divided storage capacitor upper electrode (divided electrode) constitutes a storage capacitor element as a part of the storage capacitor upper electrode. Therefore, in the mode of the drain electrode of a thin film transistor being (directly) connected to a pixel electrode, the above divided electrodes are respectively connected to the pixel electrode. In the mode of the drain electrode being connected to an interconnection electrode, the interconnection electrode is connected to at least one of the divided electrodes and all the divided electrodes are connected to a pixel electrode directly via a contact hole or to the pixel electrode via an interconnection electrode.

Such a constitution makes it possible to electrically separate only divided electrode containing a short-circuited site and allow the remaining divided electrode(s) to effectively function to thereby maintain the function of the storage capacitor element even in the case of short-circuiting of the storage capacitor upper electrode with the storage capacitor wiring pattern or with the data signal line formed in one and the same step as a result of occurrence of a conductive foreign material or a pinhole in the insulating layer between the storage capacitor wiring pattern and storage capacitor upper electrode. Generally, both end portions of a storage capacitor upper electrode are susceptible to short-circuiting because of there being disposed a data signal line, among others. Even when the divided electrodes at both ends are both short-circuited, however, it is now possible to allow the remaining divided electrode(s) to function effectively and thereby maintain the function of the storage capacitor element, since the storage capacitor upper electrode is divided into at least three sections in accordance with the present invention. By using such an active matrix substrate as the pixel electrode substrate of a liquid crystal display device or the like, it become possible to effectively prevent dot defects in images displayed from occurring due to storage capacitor upper electrode short-circuiting, prevent the display quality of the display device from deteriorating, and improve the yield. Thus, it can be adequately used in providing a liquid crystal panel for a large-size liquid crystal television or the like which is required to have a high level of panel quality.

The shape or shapes and the manner of disposition of the above divided electrodes are not particularly restricted but there may be mentioned, among others, the mode in which three or more square or rectangular divided electrodes are juxtaposed with one another and the mode in which two or more square or rectangular divided electrodes are juxtaposed with each other or one another in one frame-shaped divided electrode.

In the practice of the invention, the storage capacitor upper electrode may be disposed so as to oppose a scanning signal line at least via a insulating layer (gate insulator) and comprise at least three divided electrodes in the region opposing the scanning signal line. In such Cs-on-Gate system in which the scanning signal line is used as the storage capacitor lower electrode in the storage capacitor element, too, the effects of the invention can be produced in the same manner as in the Cs-on-Common system in which a storage capacitor wiring pattern is disposed as the storage capacitor lower electrode.

Preferred embodiments of the active matrix substrate of the invention are described below.

When interconnection electrodes are disposed in the practice of the invention, the active matrix substrate is preferably one such that interconnection electrode is connected to each of the divided electrodes and, in case of short-circuiting of one of the divided electrodes, the interconnection electrode connected to the short-circuited divided electrode become separated and that divided electrode become electrically separated from the other divided electrodes. In accordance with the invention, any short-circuited divided electrode can be electrically separated with ease according to need, for example in the case of short-circuiting of the divided electrode, by partly destructing and separating the interconnection electrode in question by means of a laser or the like. In the practice of the invention, when there is no interconnection electrode disposed, the above-mentioned active matrix substrate is preferably one such that the divided electrodes are respectively connected to a pixel electrode via a contact hole and, in the case of short-circuiting of one divided electrode, the divided electrode is separated form the pixel electrode and the divided electrode is thereby electrically separated from the other divided electrodes. When such an active matrix substrate is used as the pixel electrode substrate of a display device, dot defects due to short-circuiting are repaired in a state close to normal pixels.

In the practice of the invention, each interconnection electrode preferably has at least two routes. As typical modes of such an interconnection electrode, there may be mentioned (1) the mode in which one interconnection electrode connected to a thin film transistor ramifies into two or more branches to be connected to a storage capacitor upper electrode, (2) the mode in which two or more interconnection electrodes connected to a thin film transistor are combined into one to be connected to a storage capacitor upper electrode, and (3) the mode in which two or more interconnection electrodes connected to a thin film transistor are connected, with or without cross linking, to a storage capacitor upper electrode. Among them, the mode (3) is preferred. When the interconnection electrode is given such a form, the data signal from a thin film transistor is sent to the relevant storage capacitor upper electrode via two or more routes and, therefore, the possibility of the thin film transistor and storage capacitor upper electrode being insulated from each other due to partial disconnection of the interconnection electrode can be reduced. When such an active matrix substrate is used as the pixel electrode substrate of a display device such as a liquid crystal display device, the occurrence of dot defects in displayed images as resulting from disconnection of interconnection electrodes can be effectively prevented, the display quality of the display device can be prevented from deteriorating, and the yield can be improved.

In cases where interconnection electrodes are disposed in the practice of the invention, each storage capacitor upper electrode is preferably connected to a pixel electrode via at least one contact hole disposed on at least one of the divided electrodes. When an active matrix substrate is used in a liquid crystal display device or the like, either of the sites of contact hole formation or the sites of storage capacitor upper electrode formation are difficult to utilize as aperture sites. By disposing these on the same sites on the substrate, it becomes possible to increase the aperture ratio. The contact hole is not particularly restricted provided that it can electrically connect the divided electrodes to the relevant pixel electrode. When the divided electrodes and pixel electrode are disposed via an insulating layer, it may be a conductive material, such as a metal, formed on the inside wall of a through hole penetrating the insulating layer or a conductive material filled within the through hole, for instance.

When interconnection electrodes are disposed in the practice of the invention, the divided electrode or electrodes to be equipped with the above-mentioned contact hole may be adequately selected according to the distance between the data signal line and divided electrode(s), and the shape and manner of disposition of the divided electrode(s). As preferred modes of the contact hole, there may be mentioned, among others, (1) the mode in which it is disposed on at least one of the divided electrodes occurring (located) at both ends, (2) the mode in which it is disposed on at least one of the divided electrodes other than the divided electrodes occurring at both ends, and (3) the mode in which it is disposed at least on each of the divided electrodes occurring at both ends. In many cases, the divided electrodes occurring at both ends are close to the relevant data signal line, hence are susceptible to short-circuiting with the data signal line. When a divided electrode on which no contact hole is disposed is short-circuited with the data signal line, however, it is not necessary to eliminate the pixel electrode on the contact hole but it is possible to electrically separate the short-circuited divided electrode from the other divided electrodes with ease by destructing and separating a part of the interconnection electrode by means of a laser, for instance and, thus, the short circuit between the data signal line and the drain electrode of the thin film transistor can be repaired. On the contrary, when a divided electrode on which a contact hole is disposed is short-circuited with the data signal line, repairs may become difficult to carry out in some instances; it becomes necessary to repair the short circuit between the data signal line and the pixel electrode on the contact hole, for example, by eliminating the pixel electrode on the contact hole.

In the above-mentioned mode (1), one (the other) of the divided electrodes occurring at both ends is not equipped with a contact hole and, accordingly, the possibility of short-circuiting of the divided electrode, on which a contact hole is formed, with the data signal line can be reduced. In the above-mentioned mode (2), either of both the divided electrodes occurring at both ends is not equipped with a contact hole and, accordingly, the possibility of short-circuiting of the divided electrode, on which a contact hole is formed, with the data signal line can be more effectively reduced. On the contrary, in the above-mentioned mode (3), the number of contact holes can be increased and the reliability of connection between the storage capacitor upper electrode and pixel electrode can be increased. when the distance between the data signal line and divided electrodes occurring at both ends is great, for instance, the mode (3) is preferred.

As for the storage capacitor upper electrode mentioned above, the divided electrodes occurring at both ends of the storage capacitor upper electrode are preferably smaller in the total area of the region opposing the storage capacitor wiring pattern or scanning signal line as compared with the other divided electrode or electrodes. In this case, when there are two or more other divided electrodes, the sum of the areas overlapping between their electrodes and the storage capacitor wiring pattern or scanning signal line is used in comparing with the sum of the areas overlapping between the divided electrodes occurring at both ends and the storage capacitor wiring pattern or scanning signal line. In this mode, the divided electrodes occurring at both ends where short-circuiting with the data signal line tends to occur are made small, so that even if these divided electrodes are electrically separated as a result of short circuit repair, the decrease in the capacity of the storage capacitor element can be reduced. Further, when the divided electrodes not occurring at either end are the same in size, it is also possible to increase the distance between the divided electrodes occurring at both ends and the data signal line to thereby prevent the short-circuiting of the divided electrodes occurring at both ends.

Further, when interconnection electrodes are provided in the practice of the invention, the storage capacitor upper electrode is preferably such that the divided electrode provided with a contact hole is small in area. This makes it possible to reduce the possibility of short-circuiting between the divided electrode provided with a contact hole and the storage capacitor wiring pattern or scanning signal line. More preferably, the storage capacitor upper electrode consists of at least three divided electrodes in the region opposing the storage capacitor wiring pattern or scanning signal line and is connected to a pixel electrode via at least one contact hole disposed on the divided electrode not occurring at either end and the divided electrode provided with the contact hole is smaller in the area of the region opposing the storage capacitor wiring pattern or scanning signal line as compared with the divided electrode(s) occurring at both ends. In this case, the comparison is made between the divided electrode smallest in the area of the region opposing the storage capacitor wiring pattern or scanning signal line out of the divided electrodes occurring at both ends and the divided electrode greatest in the area of the region opposing the storage capacitor wiring pattern or scanning signal line out of the divided electrodes equipped with a contact hole (if there are two or more such divided electrodes). In this mode, the area of the divided electrode provided with a contact hole is made small and neither of the divided electrodes occurring at both ends is provided with a contact hole, so that the possibility of short-circuiting of the divided electrode, on which a contact hole is formed, with the storage capacitor wiring pattern or scanning signal line and with the data signal line is reduced. Still more preferably, the storage capacitor upper electrode has a form such that it comprises three or more divided electrodes in the region opposing the storage capacitor wiring pattern or scanning signal line and is connected to a pixel electrode via one or more contact holes disposed on the divided electrode or electrodes not occurring at either end and the divided electrode or electrodes other than the divided electrodes occurring at both ends are smaller in the area of the region opposing the storage capacitor wiring pattern or scanning signal line than the divided electrodes occurring at both ends. In this case, the area comparison is made between the divided electrode smaller in the area of the region opposing the storage capacitor wiring pattern or scanning signal line out of the divided electrodes occurring at both ends and the divided electrode greatest in the area of the region opposing the storage capacitor wiring pattern or scanning signal line out of the divided electrodes not occurring at either end (if there are two or more such divided electrodes).

The present invention further relates to a display device equipped with the above-mentioned active matrix substrate. In such display device, the above active matrix substrate is used as a pixel electrode substrate and, therefore, the occurrence of dot defects in images displayed as caused by short-circuiting of the storage capacitor upper electrode is effectively suppressed, the display quality is prevented from deteriorating, and a high manufacturing yield can be attained. The above display device is preferably a liquid crystal display device, among others.

The active matrix substrate of the invention has the constitution described above and each storage capacitor upper electrode comprises three or more divided electrodes in the region opposing the storage capacitor wiring pattern or scanning signal line and, therefore, even when the storage capacitor upper electrode is short-circuited with the storage capacitor wiring pattern or scanning signal line due to a conductive foreign material or a pinhole in the insulating layer or with the data signal line formed in the same step, it is possible to electrically separate only the divided electrode containing the short circuit site to allow the remaining divided electrodes to function effectively and thereby maintain the function of the storage capacitor element. Generally, both end portions of a storage capacitor upper electrode are susceptible to short-circuiting because of there being disposed a data signal line, among others. Even when both divided electrodes at both ends are short-circuited, it is now possible to allow the remaining divided electrode or electrodes to function effectively and thereby maintain the function of the storage capacitor element. When such active matrix substrate is used as a pixel-electrode-disposed substrate in a display device such as a liquid crystal display device, the appearance of dot defects in images displayed as caused by short-circuiting of the storage capacitor upper electrode can be effectively suppressed, the display quality of the display device can be prevented from deteriorating, and the yield can be improved. Thus, the active matrix substrate can be adequately used in a liquid crystal panel, such as a large-size liquid crystal television, of which a high level of panel quality is required.

In the following, some typical examples are given and the present invention is described in further detail, referring to the drawings. These examples are, however, by no means limitative of the scope of the invention.

EXAMPLE 1

Figure 2:
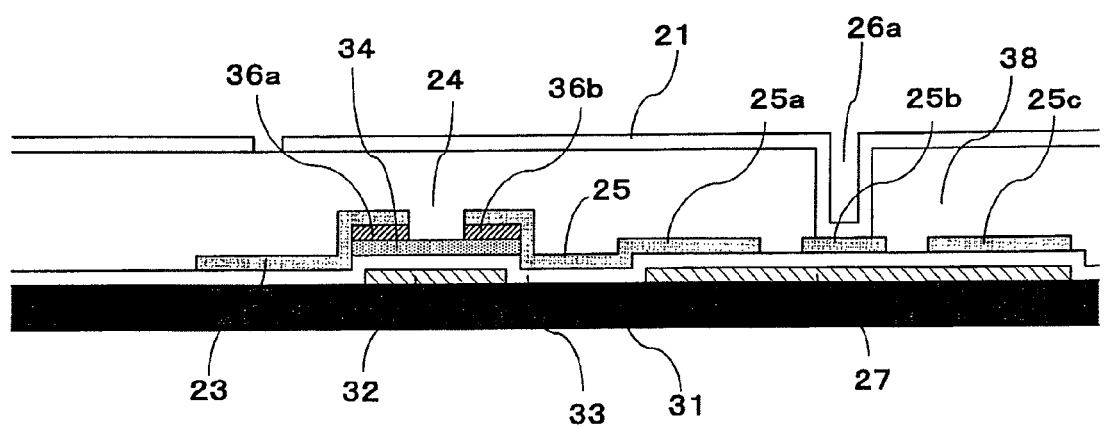
FIG. 2 is a schematic sectional view showing a section of the active matrix substrate shown in FIG. 1 as cut along the line D-D' in FIG. 1.

In Example 1, referring to FIG. 1 and FIG. 2, a mode of practice using the Cs-on-Common system in which a storage capacitor (common) wiring pattern is formed as the storage capacitor lower electrode is described.

FIG. 1 is a schematic plan view illustrating the constitution of one pixel in an active matrix substrate in one mode of embodiment of the invention, and FIG. 2 is a schematic sectional view showing a section of the active matrix substrate shown in FIG. 1 as cut along the line D-D'.

Referring to FIG. 1, in the active matrix substrate, a plurality of pixel electrodes 21 is disposed to form a matrix. Around each of these pixel electrodes 21, there are disposed, in a manner crossing with each other, each scanning signal line 22 for scanning signal feeding, and a data signal line 23 for data signal feeding. At the crossing point of the scanning signal line 22 and data signal line 23, there is disposed a TFT 24 as a switching element to be connected to the pixel electrode 21. The scanning signal line 22 is connected to the gate electrode 32 of this TFT 24, and the TFT 24 is driven and controlled by a scanning signal inputted into the gate electrode 32. The data signal line 23 is connected to the source electrode 36a of the TFT 24, and a data signal is inputted into the source electrode 36a of the TFT 24. Further, to the drain electrode 36b, there are connected an interconnection electrode 25, one electrode of a storage capacitor element (storage capacitor upper electrode) comprising three divided electrodes 25a, 25b and 25c via the interconnection electrode 25, and the pixel electrode 21 via the interconnection electrode 25 and a contact hole 26a. A storage capacitor (common) wiring pattern 27 functions as the other electrode of the storage capacitor element (storage capacitor lower electrode).

Referring to FIG. 2, the gate electrode 32 connected to the scanning signal line 22 is disposed on a transparent insulating substrate (insulating substrate) 31 made of glass, plastic or like material. The scanning signal line 22 and gate electrode 32 are each formed of a layer of a metal such as titanium, chromium, aluminum or molybdenum or an alloy thereof or a laminate thereof. A storage capacitor (common) wiring pattern 27 constituting the other electrode of the storage capacitor element (storage capacitor lower electrode) is made of the same material as the scanning signal line 22 and/or gate electrode 32. A gate insulator 33 is formed on the scanning signal line 22, gate electrode 32 and storage capacitor (common) wiring pattern 27 to cover these. The gate insulator 33 is formed of an insulating layer, such as a silicon nitride or silicon oxide layer. Thereon is disposed a high-resistivity semiconductor layer 34 made of amorphous silicon or polysilicon, for instance, in a manner overlapping with the gate electrode 32. Further thereon is disposed a lower-resistivity semiconductor layer made of an impurity-doped n+ amorphous silicon to give the source electrode 36a and drain electrode 36b. The data signal line 23 is formed so as to be connected to the source electrode 36a. The interconnection electrode 25 is disposed so as to be connected to the drain electrode 36b, and the interconnection electrode 25 is extended to constitute the storage capacitor upper electrode, which serve as one electrode of the storage capacitor element and comprise three divided electrodes 25a, 25b and 25c, and is connected to the pixel electrode 21 via the contact hole 26a. The data signal line 23, interconnection electrode 25, and the storage capacitor upper electrode comprising three divided electrodes 25a, 25b and 25c are formed of the same material utilizing a layer of a metal such as titanium, chromium, aluminum or molybdenum or an alloy thereof, or a laminate thereof. The pixel electrode 21 is formed of a conductive layer having transparency, such as an ITO, IZO, zinc oxide or tin oxide layer. The contact hole 26a is formed so as to penetrate an interlayer insulation layer 38 formed to cover the top surface each of the TFT 24, scanning signal line 22, data signal line 23 and interconnection electrode 25. As the material of the interlayer insulation layer 38, there may be mentioned, for example, acrylic resins, silicon nitride, and silicon oxide.

One electrode of the storage capacitor element (storage capacitor upper electrode) is divided into three electrodes 25a, 25b and 25c in the region opposing the storage capacitor (common) wiring pattern 27, namely in the region where the electrode overlaps with the storage capacitor wiring pattern 27 to form the storage capacitor element.

The interconnection electrode 25 is connected to the divided electrodes 25a, 25b and 25c, respectively so that, in case of short-circuiting of any of the divided electrodes 25a, 25b and 25c, the short-circuited divided electrode alone can be electrically separated from the drain electrode 36b of the TFT 24. When a short circuit is formed due to a residual layer 98, for instance, the interconnection electrode 25 is destructed for separation at the cleavage site K by means of a laser, for instance, whereby the short-circuited divided electrode can be readily separated from the drain electrode 36b.

The contact hole 26a is formed on the site other than the divided electrodes 25a and 25c, which are close to the data signal line 23, namely only on the divided electrode 25b. The divided electrodes 25a and 25c are close to the data signal line 23 formed in the same step and, therefore, are susceptible to short-circuiting with the data signal line 23 due to a residual layer 98 or the like as compared with the divided electrode 25b. Therefore, if contact holes are disposed on the divided electrodes 25a and 25c and the divided electrodes 25a or 25c is short-circuited, not only the short-circuited divided electrodes 25a or 25c is to be separated from the drain electrode 36b by destruction and separation at the cleavage site K on the interconnection electrode 25 by means of a laser, for instance but also the pixel electrode 21 on the contact hole located on the short-circuited divided electrodes 25a or 25c is destructed and separated. Thus, a step of separating the pixel electrode 21 from the short-circuited divided electrode 25a or 25c becomes newly necessary. Therefore, the contact hole 26a is disposed on the divided electrode 25b, not on the divided electrodes 25a or 25c susceptible to short-circuiting, to facilitate repairing in case of short-circuiting.

In cases where the reliability of contacting is doubtful due to such problems as difficulty in connecting a layer of ITO or the like to serve as the pixel electrode 21 in the contact hole 26a with good coverage and a great difference in contact resistance between the metal layer made of aluminum, for instance, to serve as the storage capacitor electrode and the layer of ITO, for instance, to serve as the pixel electrode, the divided electrode(s) 25a and/or 25c may also be provided with a contact hole.

The area of overlapping between the divided electrode 25b, on which the contact hole 26a is disposed, and the storage capacitor (common) wiring pattern 27 is smaller than the areas of overlapping between the other divided electrodes 25a and 25c and the storage capacitor (common) wiring pattern 27. Such a structure makes it possible to reduce the possibility of short-circuiting between the divided electrode 25b and the storage capacitor (common) wiring pattern 27 via the gate insulator 33 due to the occurrence of a conductive foreign material or a pinhole 99, since the area of overlapping between the divided electrode 25b and the storage capacitor (common) wiring pattern 27 is small as compared with the areas of overlapping between the other divided electrodes 25a and 25c, which are close to the data signal line 23, and the storage capacitor (common) wiring pattern 27.

In the following, some examples of modification of Example 1 shown in FIG. 1 and FIG. 2 are further described.

In Example 1, the divided electrodes 25a, 25b and 25c are quadrilateral in shape, as shown in FIG. 1. The shape is not limited thereto but includes triangular, semicircular and trapezoidal shapes and others. Thus, it is only necessary to dispose the storage capacitor upper electrodes on the gate insulator 33 in a manner overlapping with the storage capacitor (common) wiring pattern 27 so that at least the divided electrodes close to the data signal line 23 may be separated from the other divided electrode or electrodes. The storage capacitor upper electrode shown in FIG. 1 consists of three divided electrodes 25a, 25b and 25c. The number of divisions (N) is not limited to 3 but may be four or more, i.e. $N \geq 3$.

According to the above description, the storage capacitor (common) wiring pattern 27 is formed of the same material as the scanning signal line 22 and gate electrode 32. The material to be used is not limited thereto. Thus, the storage capacitor (common) wiring pattern 27 may be formed using another material (e.g. an ITO or like transparent conductive material) before/after formation of the scanning signal line 22 and/or gate electrode 32.

In Example 1, the interconnection electrode 25 is formed in the wiring pattern shown in FIG. 1. The wiring pattern is not limited thereto, however. Thus, it is only necessary that a part of the interconnection electrode 25 connected to the drain electrode 36b be connected to the divided electrodes 25a, 25b and 25c, respectively so that, in case of short-circuiting of any of the divided electrodes 25a, 25b and 25c, the short-circuited divided electrode alone can be electrically separated from the drain electrode 36b of the TFT 24.

As for the insulating layer constituting the storage capacitor element, the gate insulator 33 alone is shown in FIG. 2 but this has no limitative meaning. Thus, a further insulation layer other than the gate insulating layer 33 may be formed on the storage capacitor (common) wiring pattern 27 before/after formation of the gate insulator 33.

EXAMPLE 2

Figure 3:
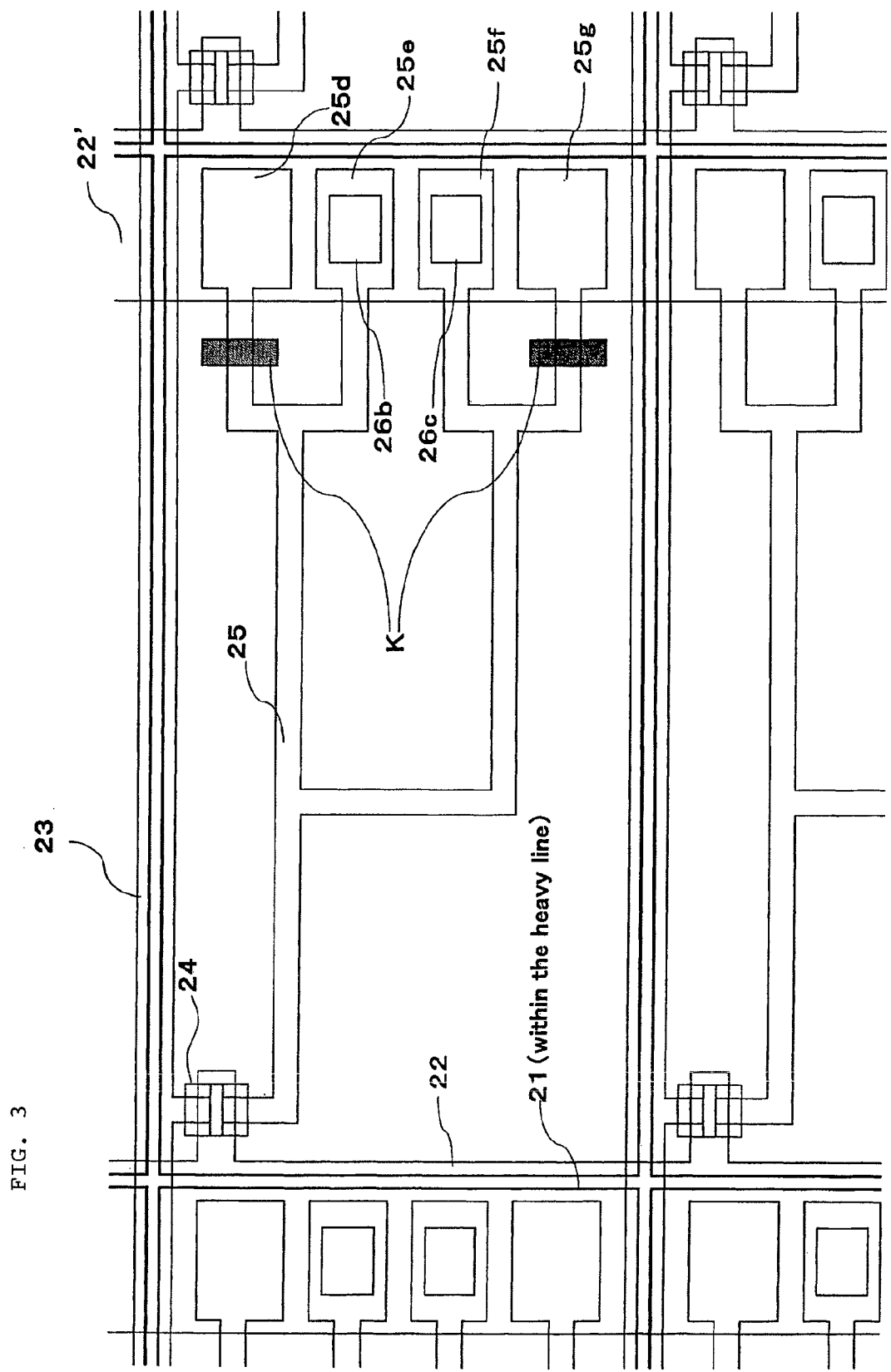
FIG. 3 is a schematic plan view showing the constitution of one pixel in an active matrix substrate in a preferred mode of embodiment of the invention (Cs-on-Gate system).
Figure 4:
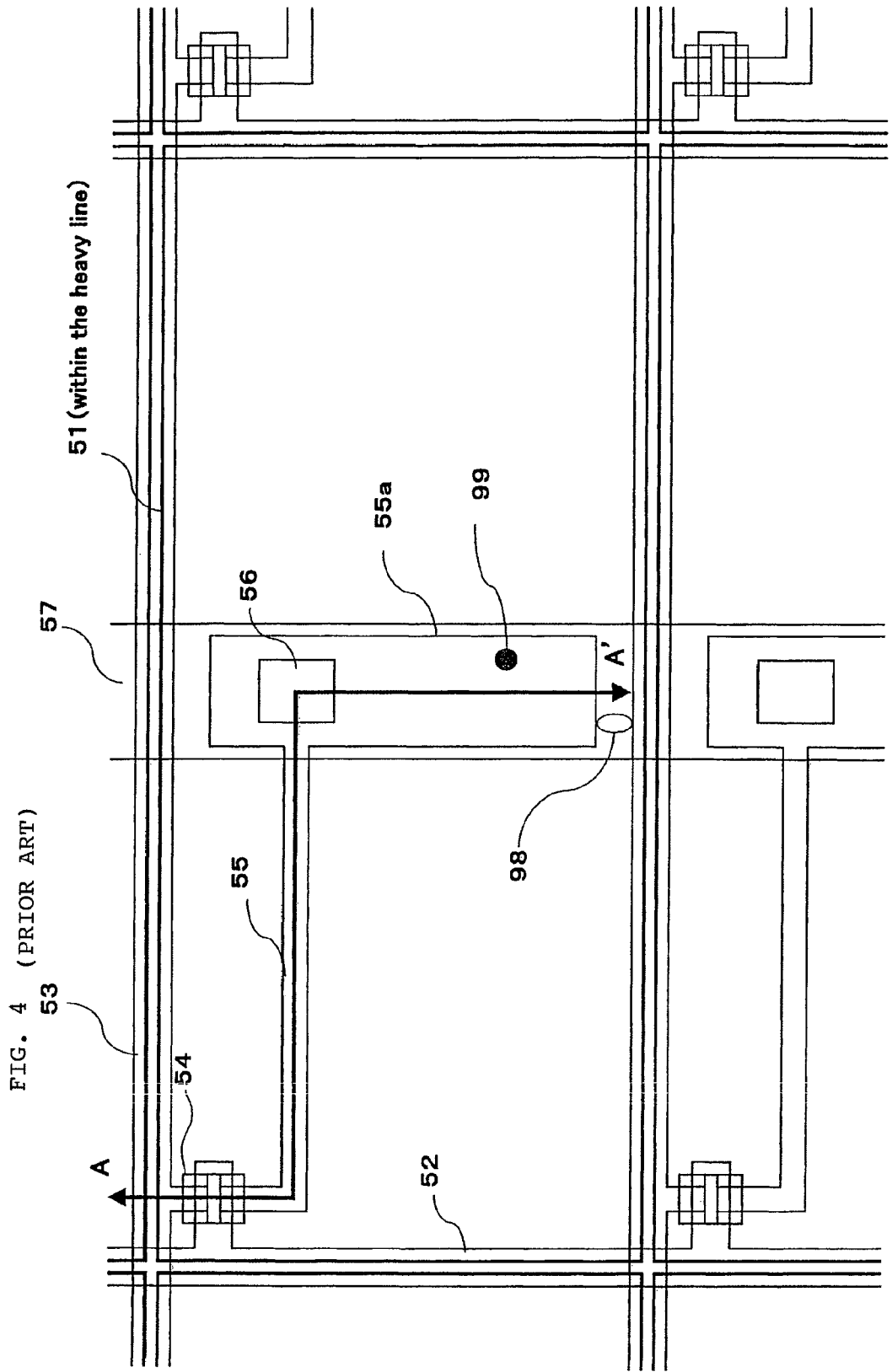
FIG. 4 is a schematic plan view showing the constitution of one pixel on a conventional active matrix substrate.
Figure 5:
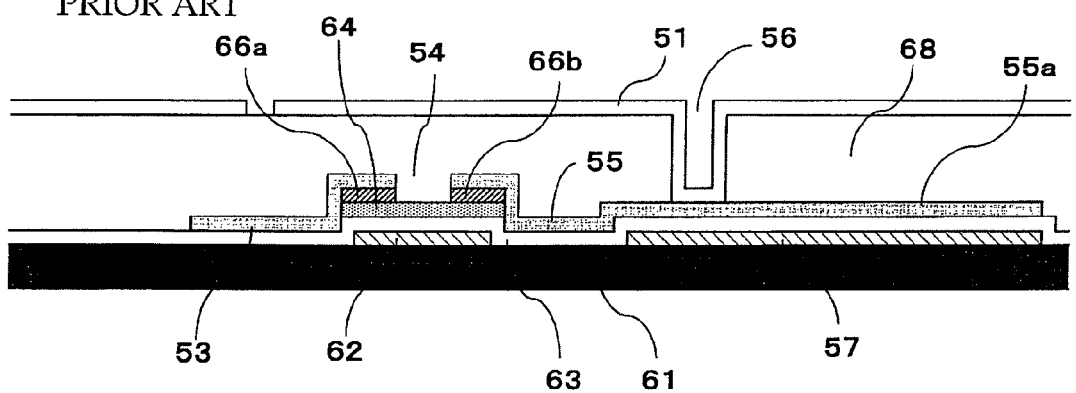
FIG. 5 is a schematic sectional view showing a section of the active matrix substrate shown in FIG. 4 as cut along the line A-A' in FIG. 4.

In Example 2, referring to FIG. 3, a mode of practice using the Cs-on-Gate system in which no storage capacitor (common) wiring pattern is disposed but a neighboring scanning signal line is utilized as the storage capacitor lower electrode is described.

FIG. 3 is a schematic plan view illustrating the constitution of one pixel in an active matrix substrate in a preferred mode of embodiment of the invention.

Referring to FIG. 3, in the active matrix substrate, a plurality of pixel electrodes 21 is disposed to form a matrix. Around each of these pixel electrodes, there are disposed, in a manner crossing with each other, a scanning signal line 22 for scanning signal feeding, and a data signal line 23 for data signal feeding. At the crossing point of the scanning signal line 22 and data signal line 23, there is disposed a TFT 24 as a switching element to be connected to the pixel electrode 21. The scanning signal line 22 is connected to the gate electrode of this TFT 24, and the TFT 24 is driven and controlled by a scanning signal inputted into the gate electrode. The data signal line 23 is connected to the source electrode of the TFT 24, and a data signal is inputted into the source electrode of the TFT 24. Further, to the drain electrode, there are connected an interconnection electrode 25, one electrode of a storage capacitor element (storage capacitor upper electrode) comprising four divided electrodes 25d, 25e, 25f and 25g via the interconnection electrode 25, and the pixel electrode 21 via the interconnection electrode 25 and contact holes 26b and 26c. A neighboring scanning signal line 22' is utilized as the other electrode of the storage capacitor element (storage capacitor lower electrode).

One electrode of the storage capacitor element (storage capacitor upper electrode) is divided into four divided electrodes 25d, 25e, 25f and 25g in the region opposing the neighboring scanning signal line 22', namely in the region overlapping with the pattern of the neighboring scanning signal line 22' and forming the storage capacitor element.

The interconnection electrode 25 is connected to the divided electrodes 25d, 25e, 25f and 25g, respectively so that, in case of short-circuiting of any of the divided electrodes 25d, 25e, 25f and 25g, the short-circuited divided electrode alone can be electrically separated from the drain electrode of the TFT 24. When a short circuit is formed due to a residual layer, for instance, the interconnection electrode 25 is destructed for separation at the cleavage site K by means of a laser, for instance, whereby the short-circuited divided electrode can be readily separated from the drain electrode.

The contact holes 26b and 26c are formed on the sites other than the divided electrodes 25d and 25g, which are close to the data signal line 23, namely only on the divided electrodes 25e and 25f.

The divided electrodes 25d and 25g are close to the data signal line 23 formed in the same step and, therefore, are susceptible to short-circuiting with the data signal line 23 due to a residual layer, any conductive foreign material or the like as compared with the divided electrodes 25e and 25f. Therefore, if contact holes are disposed on the divided electrodes 25d and 25g and the divided electrode 25d or 25g is short-circuited, not only the short-circuited divided electrode 25d or 25g is to be separated from the drain electrode of the TFT 24 by destruction and separation at the cleavage site K on the interconnection electrode 25 by a laser, for instance but also the contact hole located on the short-circuited divided electrode 25d or 25g is destructed and separated. Thus, a step of separating that divided electrode also from the pixel electrode 21 becomes newly necessary. Therefore, the contact holes 26b and 26c are disposed on the divided electrodes 25e and 25f, not on the divided electrodes 25d or 25g susceptible to short-circuiting, to facilitate repairing in case of short-circuiting.

In cases where the reliability of contacting is doubtful due to such problems as difficulty in forming a layer of ITO or the like to serve as the pixel electrode 21 in the contact holes 26b and 26c with good coverage and a great difference in contact resistance between the metal layer made of aluminum, for instance, to serve as the storage capacitor upper electrode and the layer of ITO, for instance, to serve as the pixel electrode, the divided electrode(s) 25d and/or 25g may also be provided with a contact hole.

The areas of overlapping between the divided electrodes 25e and 25f, on which the contact holes 26b and 26c are disposed, and the neighboring scanning signal line 22' are smaller than the areas of overlapping between the other divided electrodes 25d and 25g and the neighboring scanning signal line 22'. Such a structure makes it possible to reduce the possibility of short-circuiting between the divided electrodes 25e and 25f and the neighboring scanning signal line 22' via an insulating layer constituting the storage capacitor element due to the occurrence of a conductive foreign material or a pinhole, since the areas of overlapping between the divided electrodes 25e and 25f and the neighboring scanning signal line 22' are small as compared with the areas of overlapping between the other divided electrodes 25d and 25g and the neighboring scanning signal line 22'.

In the following, some examples of modification of Example 2 shown in FIG. 3 are further described.

In Example 2, the divided electrodes 25d, 25e, 25f and 25g are quadrilateral in shape, as shown in FIG. 3. The shape is not limited thereto but includes triangular, semicircular and trapezoidal shapes and others. Thus, it is only necessary to dispose the storage capacitor upper electrodes on the insulating layer of the storage capacitor element in a manner overlapping with the pattern of the neighboring scanning signal line 22' so that at least the divided electrodes close to the data signal line 23 may be separated from the other divided electrode or electrodes. The storage capacitor upper electrode shown in FIG. 3 consists of four divided electrodes 25d, 25e, 25f and 25g. The number of divisions (N) is not limited to 4 but the necessary condition is that N≧3.

In Example 2, the interconnection electrode 25 is formed in the wiring pattern shown in FIG. 3. The wiring pattern is not limited thereto, however. Thus, it is only necessary that a part of the interconnection electrode 25 connected to the drain electrode be connected to the divided electrodes 25d, 25e, 25f and 25g, respectively so that, in case of short-circuiting of any of the divided electrodes 25d, 25e, 25f and 25g, the short-circuited divided electrode alone can be electrically separated from the drain electrode of the TFT 24.

EXAMPLE 3

Figure 6:
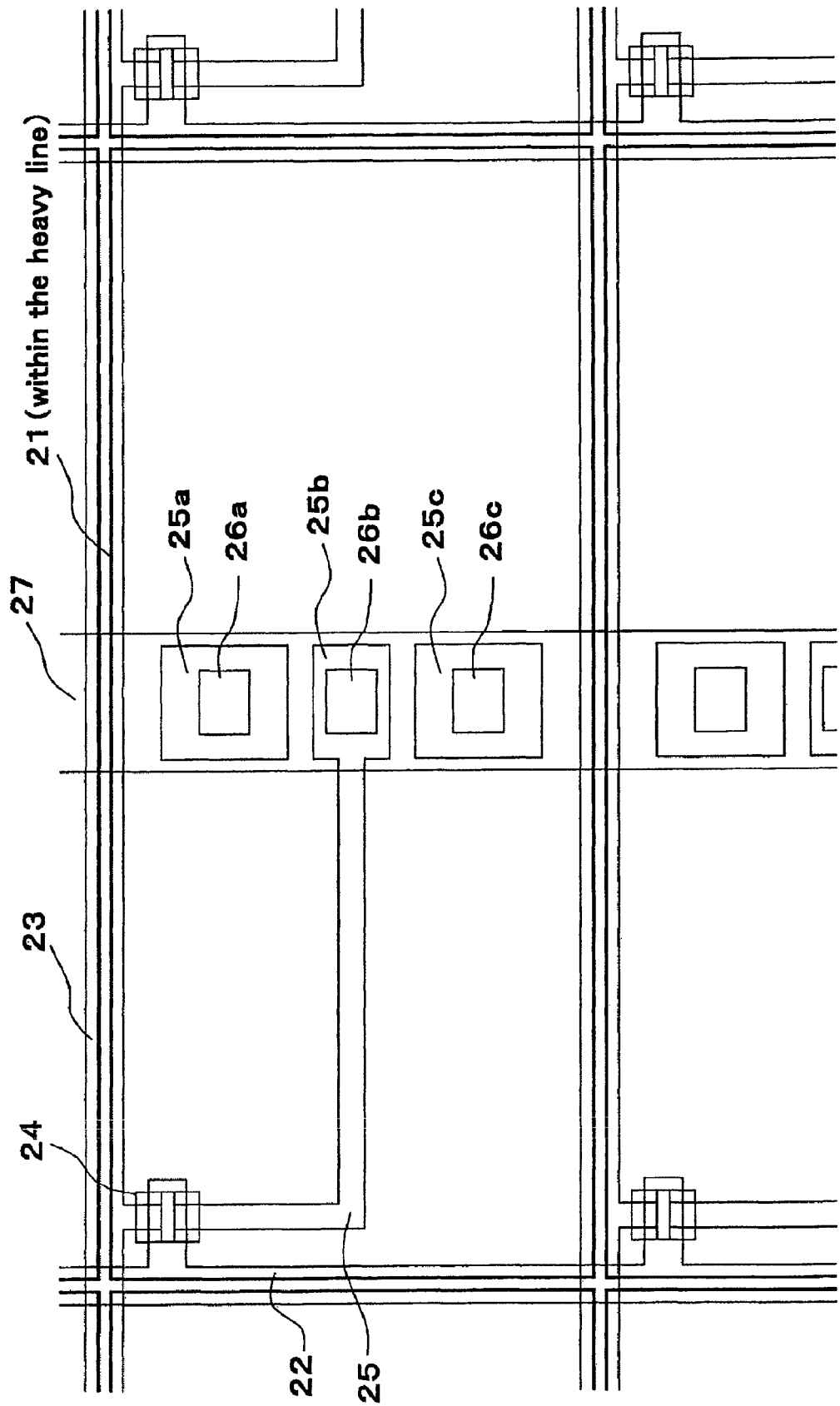
FIG. 6 is a schematic plan view showing the constitution of one pixel on the active matrix substrate described in Example 3.

In Example 3, referring to FIG. 6, a mode of practice using the Cs-on-Common system in which a drain electrode is connected to a storage capacitor upper electrode via an interconnection wiring pattern is described.

FIG. 6 is a schematic plan view illustrating the constitution of one pixel on an active matrix substrate in a preferred mode of embodiment of the invention.

Referring to FIG. 6, in the active matrix substrate, a plurality of pixel electrodes 21 is disposed to form a matrix. Around each of these pixel electrodes 21, there are disposed, in a manner crossing with each other, a scanning signal line 22 for scanning signal feeding, and a data signal line 23 for data signal feeding. At the crossing point of the scanning signal line 22 and data signal line 23, there is disposed a TFT 24 as a switching element to be connected to the pixel electrode 21. The scanning signal line 22 is connected to the gate electrode of this TFT 24, and the TFT 24 is driven and controlled by a scanning signal inputted into the gate electrode. The data signal line 23 is connected to the source electrode of the TFT 24, and a data signal is inputted into the source electrode of the TFT 24. Further, to the drain electrode, there are connected an interconnection electrode 25, one electrode of a storage capacitor element (storage capacitor upper electrode) 25b via the interconnection electrode 25, and the pixel electrode 21 via the interconnection electrode 25 and a contact hole 26b.

One electrode of the storage capacitor element (storage capacitor upper electrode) is divided into three divided electrodes 25a, 25b and 25c in the region opposing a storage capacitor wiring pattern 27, namely in the region of overlapping of the electrode with the storage capacitor wiring pattern 27 to form the storage capacitor element. This constitution makes it possible, in case of short-circuiting of at least one of the divided electrodes 25a and 25c at both ends, which are close to the data signal line, to separate the short-circuited divided electrode 25a and/or 25c from the pixel electrode 21 by means of a laser or the like (namely eliminate the pixel electrode on and around the contact hole 26a and/or 26c) to thereby allow the remaining divided electrode(s) to function effectively and thus maintain the function of the storage capacitor element.

The interconnection electrode 25 is connected only to the middle divided electrode 25b, which does not neighbor the data signal line 23, among the three divided electrodes 25a, 25b and 25c. The divided electrodes 25a and 25c neighboring the data signal line 23 are connected to the pixel electrode 21 via the contact holes 26a and 26c, respectively, and further connected to the drain electrode of the thin film transistor 24 via the pixel electrode 21. The divided electrodes 25a, 25b and 25c, together with the storage capacitor wiring pattern 27, constitute the storage capacitor element.

In this example, the interconnection electrode 25 is not connected to all the divided electrodes 25a, 25b and 25c but only to one divided electrode 25b, and the number of lines and routes of the interconnection electrode 25 can thereby be reduced. Therefore, the area of the interconnection electrode 25, which becomes a light-shielding area, can be reduced and, thus, the aperture ratio can be prevented from lowering. When the divided electrodes 25a and 25c are connected only to the pixel electrode 21 via the contact holes 26a and 26c but are not connected to the interconnection electrode 25, as in this example, it is not necessary, in case of short-circuiting of the divided electrodes 25a or/and 25c with the data signal line 23 or interlayer-short-circuiting thereof with the storage capacitor wiring pattern 27, to electrically separate the interconnection electrode 25 from the divided electrodes 25a or/and 25c on the occasion of repairing, hence the addition of a new step can be avoided.

In the following, some examples of modification of Example 3 are further described.

In this example, the interconnection electrode 25 is connected to the middle divided electrode 25b among the three divided electrodes 25a, 25b and 25c. This has no limitative meaning, however. Thus, when contact holes 26a, 26b and 26c are disposed on the respective divided electrodes 25a, 25b and 25c and the all divided electrodes 25a, 25b and 25c are connected to the pixel electrode 21 via the contact holes 26a, 26b and 26c and the interconnection electrode 25 is connected to at least one of the divided electrodes 25a, 25b and 25c, all the divided electrodes 25a, 25b and 25c can be connected to the drain electrode of the thin film transistor 24.

In this example, too, the shape of the divided electrodes 25a, 25b and 25c, the number of divided electrodes, and the pattern of the interconnection electrode 25 are not particularly restricted to those described, like in Example 1.

EXAMPLE 4

Figure 7:
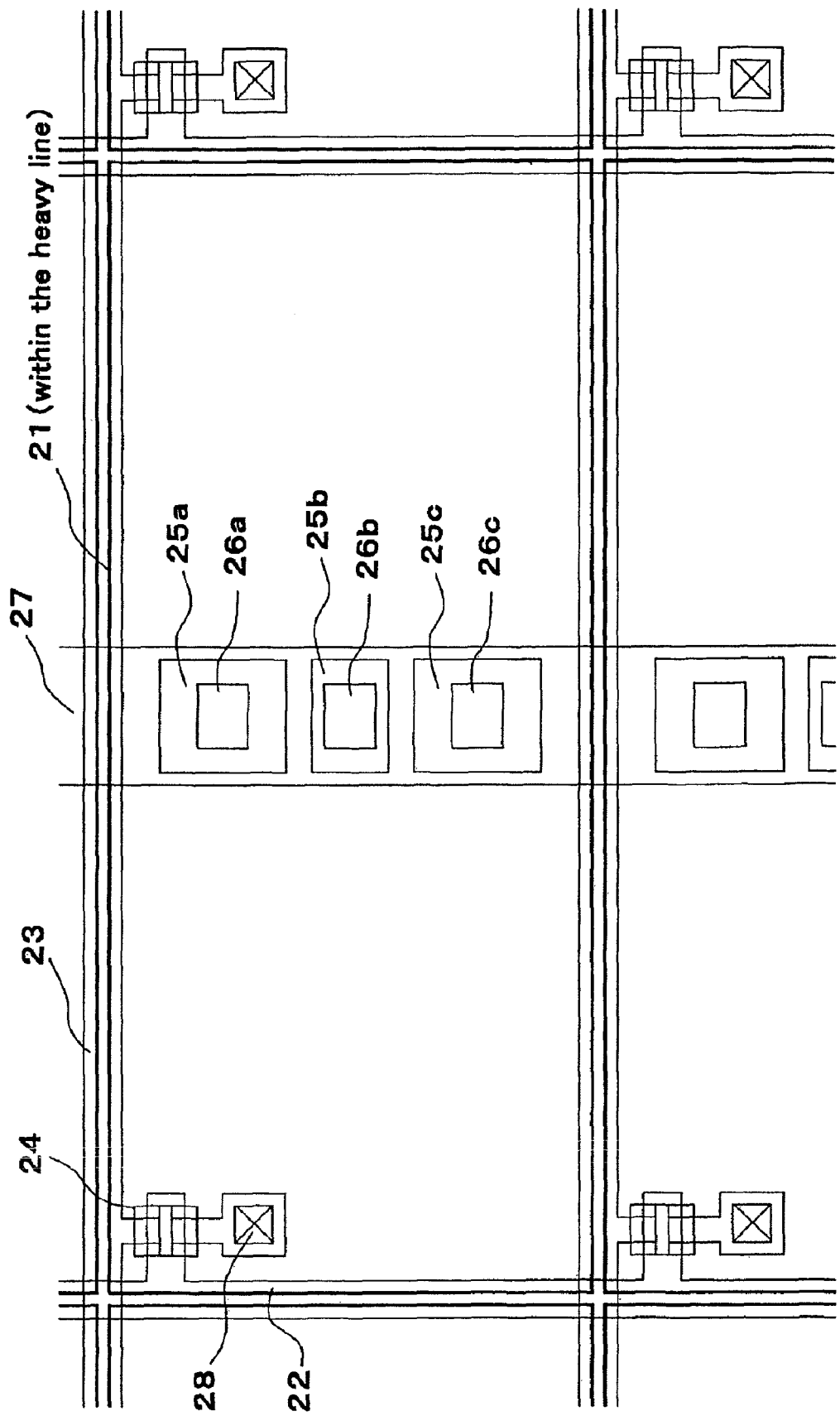
FIG. 7 is a schematic plan view showing the constitution of one pixel on the active matrix substrate described in Example 4.

In Example 4, referring to FIG. 7, a mode of practice using the Cs-on-Common system in which a drain electrode is connected to a pixel electrode directly via a contact hole without passing through any interconnection electrode.

FIG. 7 is a schematic plan view illustrating the constitution of one pixel in an active matrix substrate in a preferred mode of embodiment of the invention.

Referring to FIG. 7, in the active matrix substrate, a plurality of pixel electrodes 21 is disposed to form a matrix. Around each of these pixel electrodes 21, there are disposed, in a manner crossing with each other, a scanning signal line 22 for scanning signal feeding, and a data signal line 23 for data signal feeding. At the crossing point of the scanning signal line 22 and data signal line 23, there is disposed a TFT 24 as a switching element to be connected to the pixel electrode 21. The scanning signal line 22 is connected to the gate electrode of this TFT 24, and the TFT 24 is driven and controlled by a scanning signal inputted into the gate electrode. The data signal line 23 is connected to the source electrode of the TFT 24, and a data signal is inputted into the source electrode of the TFT 24. Further, to the drain electrode, there is connected the pixel electrode 21 via a contact hole 28. One electrode of a storage capacitor element (storage capacitor upper electrode) comprising divided electrodes 25a, 25b and 25c is connected to the pixel electrode 21 via contact holes 26a, 26b and 26c, and constitutes, together with a storage capacitor wiring pattern 27, the storage capacitor element. Thus, there is no interconnection electrode disposed, and the drain electrode of the TFT 24 is connected to the storage capacitor upper electrode comprising divided electrodes 25a, 25b and 25c via the contact holes 26a, 26b and 26c formed on the respective divided electrodes 25a, 25b and 25c, the pixel electrode 21 and the contact hole 28.

One electrode of the storage capacitor element (storage capacitor upper electrode) is divided into three divided electrodes 25a, 25b and 25c in the region opposing a storage capacitor wiring pattern 27, namely in the region of overlapping of the electrode with the storage capacitor wiring pattern 27 to form the storage capacitor element. This constitution makes it possible, even in case of short-circuiting of one or two of the divided electrodes, to separate the short-circuited divided electrode(s) from the pixel electrode 21 by means of a laser, for instance, to thereby allow the remaining divided electrode(s) to function effectively and thus maintain the function of the storage capacitor element. Further, this constitution in which no interconnection electrode is present makes it possible to prevent the aperture ratio from decreasing due to the occurrence of an interconnection electrode as compared with the constitution in which the drain electrode and storage capacitor wiring pattern are connected to each other via an interconnection electrode.

In this example, too, the shapes of the divided electrodes 25a, 25b and 25c, or the number of divided electrodes is not particularly restricted, like in Example 1.

The invention claimed is:

1. An active matrix substrate, comprising:
a thin film transistor, a scanning signal line, and a data signal line disposed on the substrate, a gate electrode of the transistor being connected to the scanning signal line, a source electrode thereof being connected to the data signal line, and a drain electrode thereof being connected to a pixel electrode; and
an upper electrode disposed so as to oppose a storage capacitor wiring pattern at least via an insulating layer, wherein, within a pixel region, the upper electrode includes three divided electrodes in a region opposing the storage capacitor wiring pattern, and
a central divided electrode of the three divided electrodes has the smallest area.

2. The active matrix substrate according to claim 1, wherein each of the divided electrodes is connected to the pixel electrode via a contact hole, and the contact hole is in a region opposing the storage capacitor wiring pattern.

3. An active matrix substrate, comprising:
a thin film transistor, a scanning signal line, and a data signal line disposed on the substrate, a gate electrode of the transistor being connected to the scanning signal line, a source electrode thereof being connected to the data signal line, and a drain electrode thereof being connected to a pixel electrode; and
an upper electrode disposed so as to oppose a storage capacitor wiring pattern at least via an insulating layer, wherein, within a pixel region, the upper electrode includes three divided electrodes in a region opposing the storage capacitor wiring pattern and at least two of the three divided electrodes having different shapes, and
a central divided electrode of the three divided electrodes has the smallest area.

4. The active matrix substrate according to claim 3, wherein each of the divided electrodes is connected to the pixel electrode via a contact hole, and the contact hole is in a region opposing the storage capacitor wiring pattern.

5. An active matrix substrate, comprising:
a thin film transistor, a scanning signal line, and a data signal line disposed on the substrate,
a gate electrode of the transistor being connected to the scanning signal line, a source electrode thereof being connected to the data signal line, and a drain electrode thereof being connected to an interconnection electrode; and an upper electrode disposed so as to oppose a storage capacitor wiring pattern at least via an insulating layer and connected to the interconnection electrode and a pixel electrode, wherein the upper electrode comprises three divided electrodes in a region opposing the storage capacitor wiring pattern, and wherein the interconnection electrode is connected only to a central divided electrode of the three divided electrodes.

* * * * *